(12) United States Patent
May et al.

(10) Patent No.: US 9,758,845 B2
(45) Date of Patent: Sep. 12, 2017

(54) MICROELECTRONIC SUBSTRATES HAVING COPPER ALLOY CONDUCTIVE ROUTE STRUCTURES

(71) Applicant: Intel Corporation, Santa Clara, CA (US)

(72) Inventors: Robert A. May, Chandler, AZ (US); Sri Ranga Sai Boyapati, Chandler, AZ (US); Amruthavalli P. Alur, Tempe, AZ (US); Daniel N. Sobieski, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 14/773,108

(22) PCT Filed: Dec. 9, 2014

(86) PCT No.: PCT/US2014/069230
§ 371 (c)(1),
(2) Date: Sep. 4, 2015

(87) PCT Pub. No.: WO2016/093799
PCT Pub. Date: Jun. 16, 2016

(65) Prior Publication Data
US 2016/0183361 A1    Jun. 23, 2016

(51) Int. Cl.
*H05K 1/09* (2006.01)
*C22C 9/00* (2006.01)
(Continued)

(52) U.S. Cl.
CPC ............... *C22C 9/00* (2013.01); *H01L 23/12* (2013.01); *H01L 23/49* (2013.01);
(Continued)

(58) Field of Classification Search
CPC ........ H05K 1/0271; H05K 1/09; H05K 1/181; H05K 3/06; H05K 2203/0723; H01J 23/12; H01J 23/49; H01J 23/49866; C22C 9/00
See application file for complete search history.

(56) References Cited

U.S. PATENT DOCUMENTS 5,627,344 A *  5/1997  Tanifuji ............ H01L 23/49883
                                                    174/256
6,090,710 A    7/2000  Andricacos et al.
(Continued)

FOREIGN PATENT DOCUMENTS

JP    10-209336 A    8/1998
JP    2002-176242 A  6/2002
(Continued)

OTHER PUBLICATIONS

International Search Report and Written Opinion received for PCT Patent Application No. PCT/US2014/069230, mailed on Aug. 28, 2015, 12 pages.
(Continued)

*Primary Examiner* — Hoa C Nguyen
(74) *Attorney, Agent, or Firm* — Winkle, PLLC (57) ABSTRACT

Microelectronic substrates having copper alloy conductive routes to reduce warpage due to differing coefficient of thermal expansion of the components used to form the microelectronic substrates. In one embodiment, the conductive routes of the microelectronic substrate may comprise an alloy of copper and an alloying metal of tungsten, molybdenum, or a combination thereof. In another embodiment, the conductive routes of the microelectronic substrate may comprise an alloy of copper, an alloying metal of tungsten, molybdenum, or a combination thereof, and a co-deposition metal of nickel, cobalt, iron, or a combination thereof. In still another embodiment, the copper alloy conductive routes (Continued)

may have copper concentrations which are graded therethrough, which may enable better pattern formation during a subtractive etching process used to form the copper alloy conductive routes.

20 Claims, 6 Drawing Sheets (51) Int. Cl.
  *H01L 23/12* (2006.01)
  *H01L 23/49* (2006.01)
  *H01L 23/498* (2006.01)
(52) U.S. Cl.
  CPC *H01L 23/49866* (2013.01); *H01L 2224/0401* (2013.01); *H01L 2224/16227* (2013.01); *H01L 2224/32225* (2013.01); *H01L 2224/73204* (2013.01); *H01L 2924/15311* (2013.01); *H01L 2924/3511* (2013.01)

(56) References Cited

U.S. PATENT DOCUMENTS 6,329,065 B1 * 12/2001 Ishida ..................... H01L 23/15
                                                            174/256
2008/0102304 A1   5/2008  Breit et al.
2012/0318568 A1  12/2012  Yamanishi et al.
2014/0284088 A1 *  9/2014  Nakamura ............. H05K 1/092
                                                            174/257

FOREIGN PATENT DOCUMENTS

| JP | 2003-11273 A | 1/2003 |
| JP | 2005-019729 A | 1/2005 |
| KR | 10-0610275 B1 | 8/2006 |
| KR | 10-2012-0115310 A | 10/2012 |
| WO | 2011/086972 A1 | 7/2011 |

OTHER PUBLICATIONS

Office Action received for Korean Patent Application No. 10-2015-7031933, mailed on Mar. 10, 2017, 10 pages of Korean Office Action including 5 pages of English Translation.

Office Action received for Japanese Patent Application No. 2016-563874, mailed on Feb. 7, 2017, 3 pages of Japanese Office Action including 1 page of English Translation.

* cited by examiner

MICROELECTRONIC SUBSTRATES HAVING COPPER ALLOY CONDUCTIVE ROUTE STRUCTURES

TECHNICAL FIELD

Embodiments of the present description generally relate to the field of microelectronic substrates, and, more particularly, using copper alloy conductive route structures within microelectronic substrates to reduce warpage thereof and using copper alloy structures of graded composition to enhance etching performance for size scaling.

BACKGROUND

The microelectronic industry is continually striving to produce ever faster and smaller microelectronic packages for use in various electronic products, including, but not limited to, computer server products and portable products, such as portable computers, electronic tablets, cellular phones, digital cameras, and the like. As these goals are achieved, the fabrication of the microelectronic packages becomes more challenging. These challenges may relate to warpage of microelectronic substrates used in the fabrication of the microelectronic packages.

Microelectronic substrates are generally composed of alternating layers of dielectric material (such as organic materials) and metal (such as copper) which is patterned to form conductive routes. At least one microelectronic die, such as a silicon die having integrated circuitry formed therein, may be physically and electrically attached to the microelectronic substrate, such that the conductive routes in the microelectronic substrate appropriately routes electronic signals to and from the integrated circuitry of the microelectronic die. However, the components of the microelectronic substrate have differing coefficients of thermal expansion. For example, at room temperature (e.g. about 25° C.), an organic dielectric material, such as a silica-filled epoxy (such as materials available from Ajinomoto Fine-Techno Co., Inc., 1-2 Suzuki-cho, Kawasaki-ku, Kawasaki-shi, 210-0801, Japan (e.g. Ajinomoto ABF GX-92)), has a coefficient of thermal expansion of about 39 ppm/° C., a metal for the conductive routes, such as copper, has a coefficient of thermal expansion of about 17 ppm/° C., and a microelectronic die, such as silicon, has a coefficient of thermal expansion of about 2.6 ppm/° C. The fundamental differences in the thermal expansion of these components may result in temperature dependent deformation or warpage of the microelectronic substrate. This warpage may cause significant issues during the attachment of the microelectronic die, such non-wet opens and solder bump bridging. This warpage can be mitigated by utilizing a thick "core" material at the center of the microelectronic substrate. This core material generally has a high glass transition temperate and a low coefficient of thermal expansion, which lowers the composite coefficient of thermal expansion of the microelectronic substrate. However, the core material coefficient of thermal expansion has already been reduced below 4 ppm/° C. and is becoming increasingly difficult to reduce further. Additionally, there is significant demand to reduce the total height or thickness of microelectronic packages. Much of this reduction is achieved by thinning the core material, in turn, giving the core material less influence on warpage. Given these factors, it is important to develop new warpage control methodologies, especially for height/thickness constrained microelectronic packages, such as those used in cellular phones and electronic tablets.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include microelectronic substrates having copper alloy conductive routes to reduce warpage due to differing coefficient of thermal expansion of the components used to form the microelectronic substrates. In one embodiment, the conductive routes of the microelectronic substrate may comprise an alloy of copper and an alloying metal of tungsten, molybdenum, or a combination thereof. In another embodiment, the conductive routes of the microelectronic substrate may comprise an alloy of copper, an alloying metal of tungsten, molybdenum, or a combination thereof, and a co-deposition metal of nickel, cobalt, iron, or a combination thereof. In still another embodiment, the copper alloy conductive routes may have copper concentrations which are graded therethrough, which may enable better pattern formation during a subtractive etching process used to form the copper alloy conductive routes.

Figure 1:
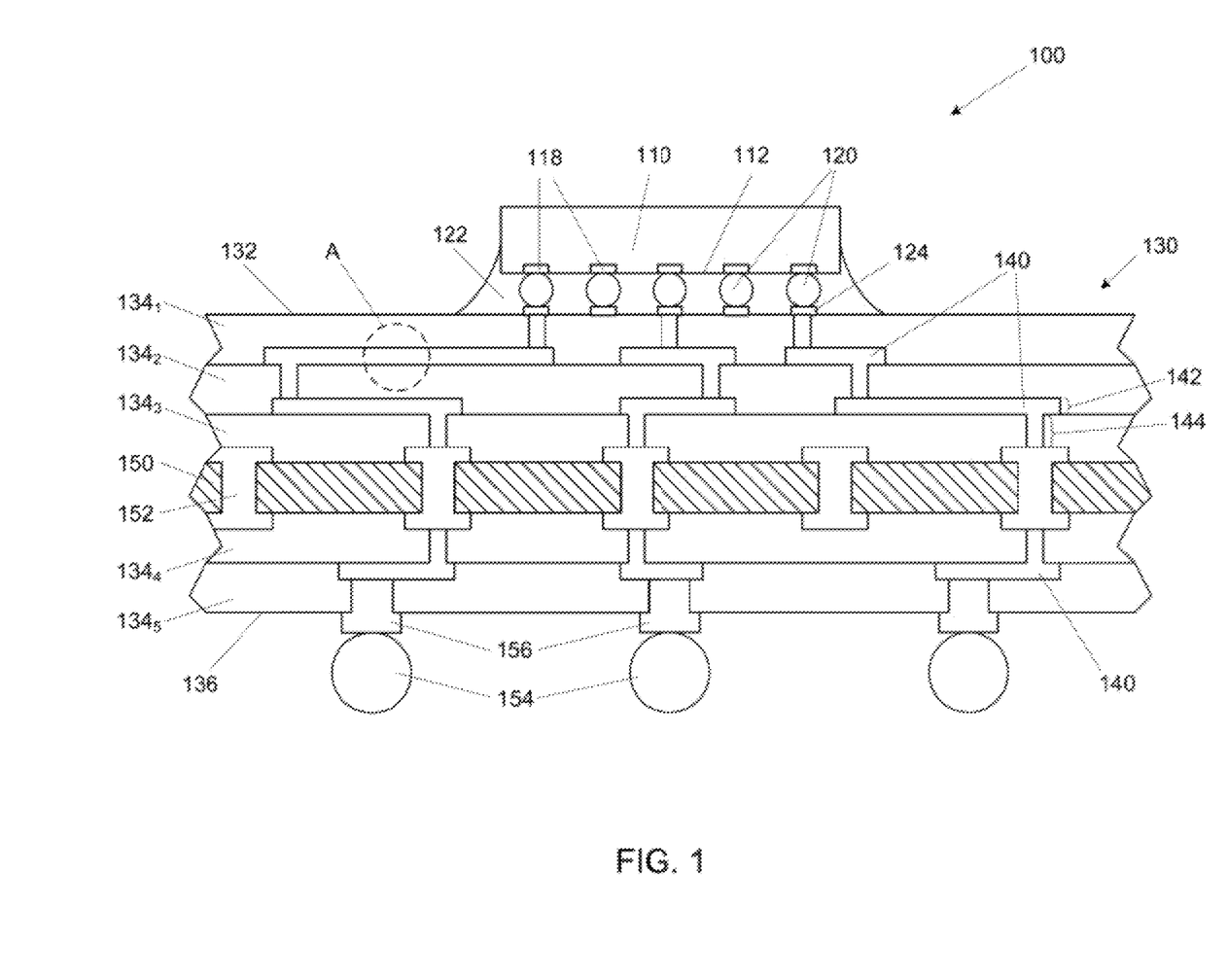
FIG. 1 illustrates a cross-sectional view of a microelectronic package, according to an embodiment of the present description.

In FIG. 1, a microelectronic package 100 may be formed with at least one microelectronic die 110, such as a microprocessor, a chipset, a graphics device, a wireless device, a memory device, an application specific integrated circuit, or the like, attached to a microelectronic substrate 130, such as an interposer, through a plurality of interconnects 120. The interconnects 120 may extend between bond pads 118 on an active surface 112 of the microelectronic die 110 and mirror-image bond pads 124 on a first surface 132 of the microelectronic substrate 130. The microelectronic die bond pads 118 may be in electrical communication with integrated circuitry (not shown) within the microelectronic die 110. The microelectronic substrate bond pads 124 may be in electrical communication with conductive routes 140 within the microelectronic substrate 130. The conductive routes 140 may provide electrical communication routes between the microelectronic die 110 on the microelectronic substrate 130 and/or to other components (not shown), and may provide electrical communication routes through attachment lands 156 to external interconnects 154 proximate a second surface 136 of the microelectronic substrate 130 for attached to a microelectronic board (not shown). The microelectronic substrate 130 may further include a core layer 150 having conductive through vias 152, such plated through-hole vias, wherein the conductive through vias 152 provide electrical routes between conductive routes 140 on opposing sides of the core layer 150.

As also shown in FIG. 1, an electrically-insulating underfill material 122, such as an epoxy material, may be disposed between the microelectronic die 110 and the microelectronic substrate 130, and around the interconnects 120 to enhance the reliability thereof.

The microelectronic die 110 may comprise any appropriate semiconducting material, including but not limited to silicon, germanium, silicon-germanium, and III-V compound semiconductor materials.

The interconnects 120 and/or the external interconnects 154 can be made any appropriate conductive material, including, but not limited to, solders and conductive filled epoxies. Solder materials may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic die 110 is attached to the microelectronic substrate 130 with interconnects 120 made of solder, the solder is reflowed, either by heat, pressure, and/or sonic energy to secure the solder between the microelectronic die bond pads 118 and the microelectronic substrate bond pads 124.

The microelectronic substrate 130 may be primarily composed of a plurality of dielectric layers (illustrated as elements $134_1$, $134_2$, $134_3$, $134_4$, and $134_5$). The dielectric layers $134_1$-$134_5$ may be made of any appropriate materials, including, but not limited to, liquid crystal polymer, epoxy resin, bismaleimine triazine resin, polybenzoxazole, polyimide material, silica-filled epoxy (such as materials available from Ajinomoto Fine-Techno Co., Inc., 1-2 Suzuki-cho, Kawasaki-ku, Kawasaki-shi, 210-0801, Japan (e.g. Ajinomoto ABF-GX13 and Ajinomoto ABF-GX92)), and the like.

As shown in FIG. 1, at least one of the conductive routes 140 may comprise at least one conductive trace portion 142 formed on at least one of the dielectric layers $134_1$-$134_5$ and at least one conductive via portion 144 formed through at least one of the dielectric layers $134_1$-$134_5$. As will be understood to those skilled in the art, the conductive trace portions 142 and the conductive via portions 144 may be formed in separate processes or in a single process. Generally, the conductive routes 140 are made from substantially pure copper. However, the copper alloys of the present description can used to form conductive routes 140 having a lower coefficient of thermal expansion and increased modulus, when compared to copper alone, which may reduce warpage of the microelectronic substrate 130. For example, copper has a coefficient of thermal expansion of about 17 ppm/° C., a resistivity of about 1.7 µΩ/cm and a Young's modulus of about 120 GPa. In comparison, a copper/tungsten alloy of $Cu_{0.25}W_{0.75}$ has a coefficient of thermal expansion of about 10 ppm/° C., a resistivity of about 3.5 µΩ/cm, and a Young's modulus of about 280 GPa.

Figure 2:
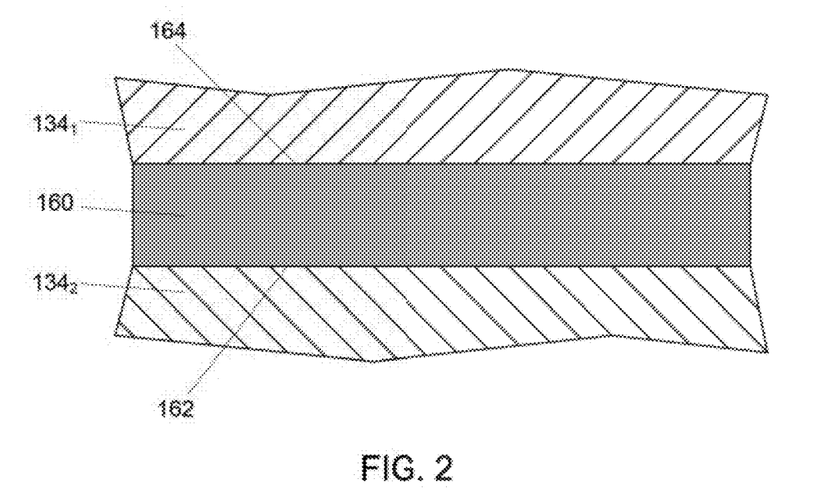
FIG. 2 illustrates a cross-sectional view of a non-graded copper alloy conductive route for a microelectronic substrate, according to an embodiment of the present description.

In embodiments of the present description, the conductive routes 140 may comprise a non-graded copper alloy (hereinafter referred to as non-graded copper alloy conductive route 160), wherein copper is alloyed with molybdenum and/or tungsten. In one embodiment, as shown in FIG. 2 (inset A for FIG. 1), the concentration of the copper and the molybdenum and/or tungsten may be substantially uniform from a first surface 162 (adjacent the dielectric material $134_1$) of the non-graded copper alloy conductive route 160 to the second surface 164 of the non-graded copper alloy conductive route 160 (wherein the non-graded nature is represented with a uniform shading within the non-graded copper alloy conductive route 160). In an embodiment of the present description, the concentration of copper in the non-graded copper alloy conductive route 160 may be between about 20% and 60% with the remainder being the alloying metal (i.e. molybdenum and/or tungsten). The values chosen in the cited range may represent a reasonable tradeoff of anti-warpage parameters (such as coefficient of thermal expansion and modulus) with conductivity, but any combination could be chosen given the parameters of a particular application, as will be understood to those skilled in the art. Any appropriate known technique may be used to form the non-graded copper alloy conductive route 160. In one embodiment, a fabrication technique may include forming a copper alloy layer in sheet form, laminating copper alloy layer to the dielectric layer 134₁, and etching the copper alloy layer to form the non-graded copper alloy conductive routes 160. In another embodiment, a fabrication technique may include electrodepositing the copper alloy layer onto the dielectric layer 134₁, and etching the copper alloy layer to form the non-graded copper alloy conductive routes 160. However, with electrodeposition, molybdenum and tungsten can only electrodeposited by co-deposition with nickel, cobalt, and/or iron. Thus, in the electrodeposition embodiment, the concentration of copper in the non-graded copper alloy conductive route 160 may be between about 20% and 60%, the alloying metal (i.e. molybdenum and/or tungsten) may be between about 40% and 80%, and the co-deposition metal (i.e. nickel, cobalt, and/or iron) may be from trace levels (close to 0%) to about 10%. The amount of co-deposition metal should generally be minimized as much as practical, as the properties thereof are generally not as desirable as copper, molybdenum, or tungsten.

Figure 3:
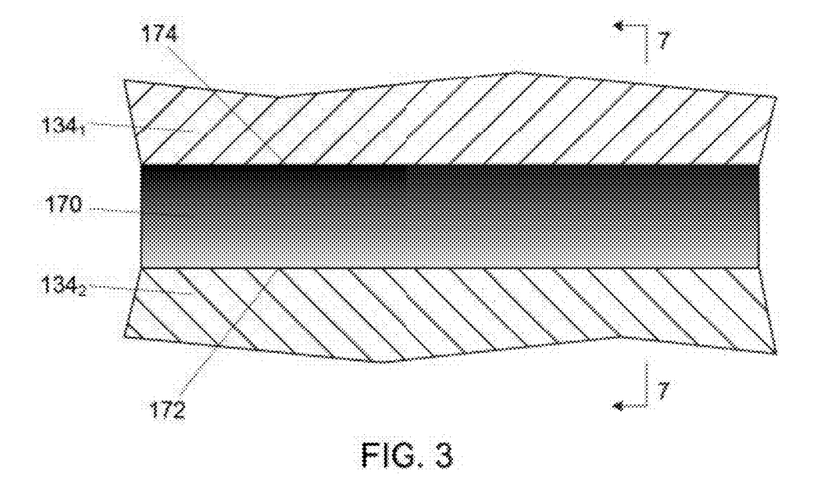
FIG. 3 illustrates a cross-sectional view of a graded copper alloy conductive route for a microelectronic substrate, according to another embodiment of the present description.

In another embodiment, as shown in FIG. 3 (inset A for FIG. 1), the conductive routes 140 of FIG. 1 may be graded (hereinafter referred to as graded copper alloy conductive route 170), wherein, as illustrated, the grading is indicated with a shading from light to dark. In a first embodiment, the darker the shading, the higher the concentration of molybdenum and/or tungsten. Thus, in the first embodiment, the concentration of copper in the graded copper alloy conductive route 170 proximate a first surface 172 (adjacent the dielectric material 134₁) of the graded copper alloy conductive route 170 may be between about 90% and 100% with the remainder, if any, being the alloying metal (i.e. molybdenum and/or tungsten), and, proximate a second surface 174 of the graded copper alloy conductive route 170, may be between about 0% and 10% with the remainder being the alloying metal (i.e. molybdenum and/or tungsten). Any appropriate known technique may be used to form the graded copper alloy conductive route 170. However, as previously discussed, with electrodeposition, molybdenum and tungsten can only electrodeposited by co-deposition with nickel, cobalt, and/or iron. Thus, in an electrodeposition embodiment of the first embodiment, the concentration the co-deposition metal (i.e. nickel, cobalt, and/or iron) may be between about trace levels to about 10%.

In a second embodiment, the darker the shading in FIG. 3, the higher the concentration of molybdenum and/or tungsten. Thus, in the second embodiment, the concentration of copper in the graded copper alloy conductive route 170 proximate a first surface 172 (adjacent the dielectric material 134₁) of the graded copper alloy conductive route 170 may be between about 0% and 10% with the remainder, if any, being the alloying metal (i.e. molybdenum and/or tungsten) and co-deposition metal, and, proximate a second surface 174 of the graded copper alloy conductive route 170, may be between about 90% and 100% with the remainder being the alloying metal (i.e. molybdenum and/or tungsten) and co-deposition metal. In an electrodeposition embodiment of the second embodiment, the concentration the co-deposition metal (i.e. nickel, cobalt, and/or iron) may be between about trace levels to about 10%.

In graded embodiments of the present description, the gradient of the concentration of copper in the graded copper alloy conductive route 170 may be substantially linear from the graded copper alloy conductive route first surface 172 to the graded copper alloy conductive route second surface 174.

Figure 4:
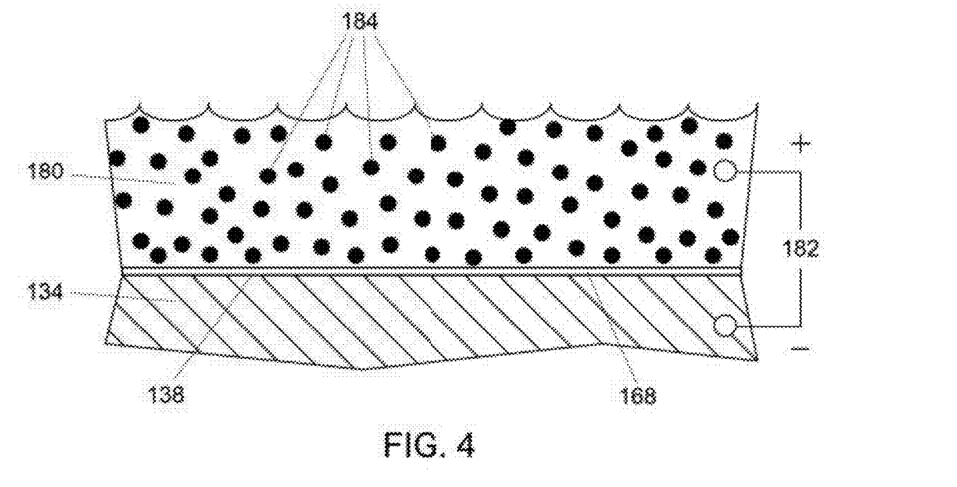
FIGS. 4-7 illustrate cross-sectional views of a process of fabricating a copper alloy conductive route for a microelectronic substrate, according to an embodiment of the present description.
Figure 5:
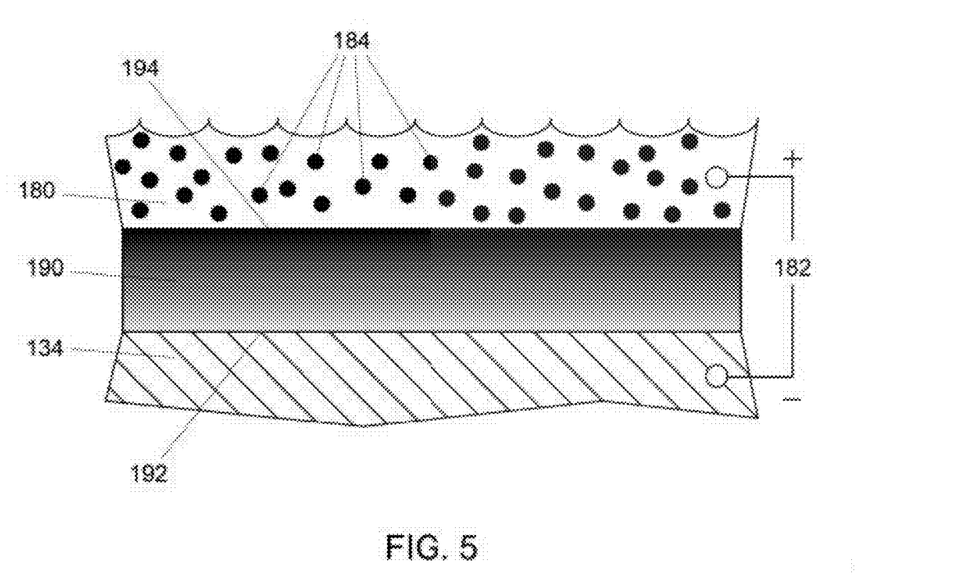

FIGS. 4-7 illustrate an electrodeposition process for forming the graded copper alloy conductive route 170 of FIG. 3 on a dielectric layer 134 (e.g. one of dielectric layers 134₁ to 134₅). As shown in FIG. 4, the dielectric layer first surface 138 may have a metallization or seed layer 168 formed thereon. Metal materials generally do not directly plate on dielectric materials; therefore, the metallization layer 168 may be formed to initiate the plating process. The metallization layer 168 may be any appropriate metal, usually copper, and may be formed by any appropriate process, including but not limited to, lamination of a metal foil, electroless plating of a metal, sputter deposition of a metal, and the like. As further shown in FIG. 4, the metallization layer 168 may be brought into contact with an electrodeposition solution 180, and an electrical potential 182 may applied between the electrodeposition solution 180 (i.e. anode "+") and the dielectric layer 134 (i.e. cathode "−"). Thus, dissolved metal salts 184 in the electrodeposition solution will be reduced at an interface between the electrodeposition solution 180 and the dielectric layer 134 to plate a metal thereon, as will be understood to those skilled in the art. Thus, the electrodeposition solution 180 will have an appropriate metal salt concentration of copper, of an alloying metal of molybdenum and/or tungsten, and of a co-deposition metal of nickel, cobalt, and/or iron, to form a graded copper alloy layer 190, as shown in FIG. 5. It is noted that the metallization layer 168 of FIG. 4 does not appear in FIG. 5, as such metallization layers are generally subsumed into the grade copper alloy layer 190 during the deposition process.

As the composition of the graded copper alloy layer 190 may be function of the applied electrical potential 182 (either controlled directly through a potentiostat or by varying the current with galvanostatic control), the application of differing electrical potentials 182 during the formation of the graded copper alloy layer 190 may result in a grading profile from a graded copper alloy layer first surface 192 to a graded copper alloy layer second surface 194, as such that a single electrodeposition solution 180 may be used. In a specific embodiment, a horizontal electroplater (not shown) may be utilized, which comprises a plurality of horizontal plating lines with a series of independently controlled anodes. Thus, the graded copper alloy layer 190 can be formed by applying different potentials to each anode of the horizontal electroplater, as the dielectric layer 134 is transported through the single electrodeposition solution 180, such by a conveyor. The specific components and operations of the horizontal eletroplater are well known in the art and for the sake of brevity and conciseness will not be discussed or illustrated herein.

Figure 6:
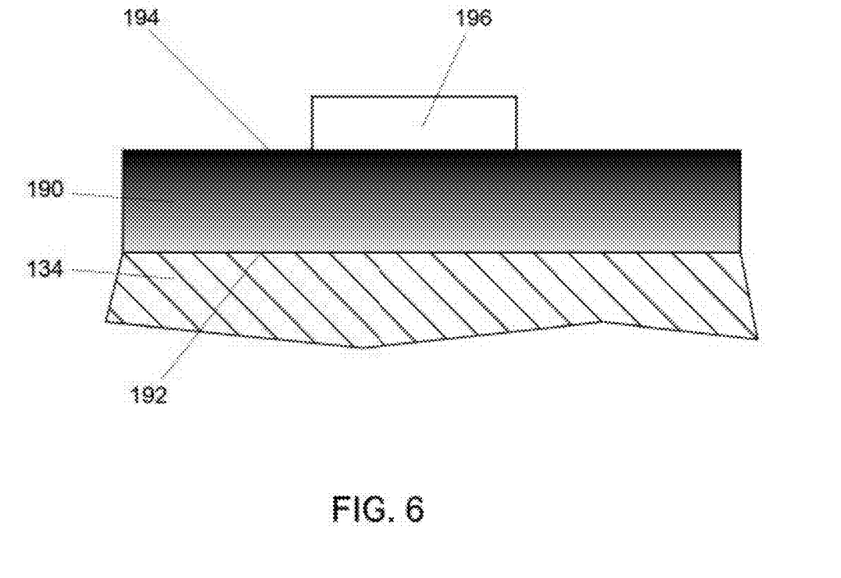
Figure 7:
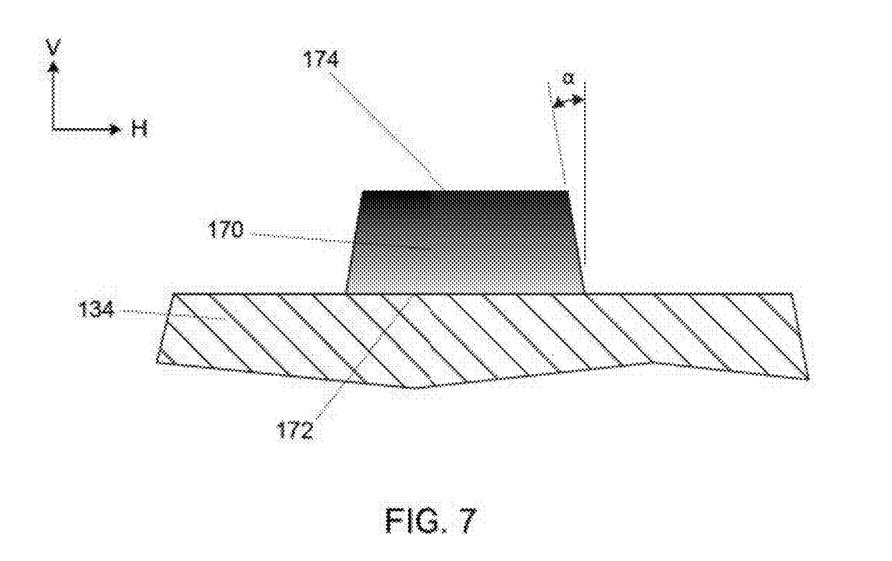

As shown in FIG. 6, after the formation of the graded copper alloy layer 190 and removal thereof from the electrodeposition solution 180 (see FIG. 5), a photoresist mask 196 may be patterned on the graded copper alloy layer second surface 194. As shown in FIG. 7, the graded copper alloy layer 190 (see FIG. 6) may be etched and the photoresist mask 196 removed to form the graded copper alloy conductive route 170 (view along line 6-6 of FIG. 3 without dielectric layer 134₁ present). The graded copper alloy layer 190 (see FIG. 6) may be advantageous in the formation of conductive routes, in general. As will be understood to those skilled in the art, the wet etching process used for etching metals is isotropic, wherein the etching solution etches in both horizontal H and vertical V direction, which gives the graded copper alloy conductive route 170 a substantially trapezoidal shape in cross section, as shown in FIG. 7. Thus, with a graded copper alloy layer 190 (see FIG. 6), the wet etching process can be tailored to etch the material proximate the graded copper alloy layer second surface 194 of FIG. 6 more slowly than the material proximate the graded copper alloy layer first surface 192 of FIG. 6, or vice versa. This will increase the "etch factor" driving an isotropic etching, which may result in a "squarer" cross sectional shape (i.e. a smaller etch angle α) of the graded copper alloy conductive route 170, as shown in FIG. 7. This squarer shape may reduce the space taken up by each conductive trace, which allows for tighter pitch scaling, as will be understood to those skilled in the art. The specific etchants and technique of wet etching metals are well known in the art and for the sake of brevity and conciseness will not be discussed or illustrated herein.

It is understood that the electrodeposition process described may be used to form the non-graded conductive trace 160 of FIG. 2 by merely keeping a substantially uniform electrical potential 182 between the electrodeposition solution 180 and the dielectric layer 134 during the formation of the non-graded conductive trace 160.

Figure 8:
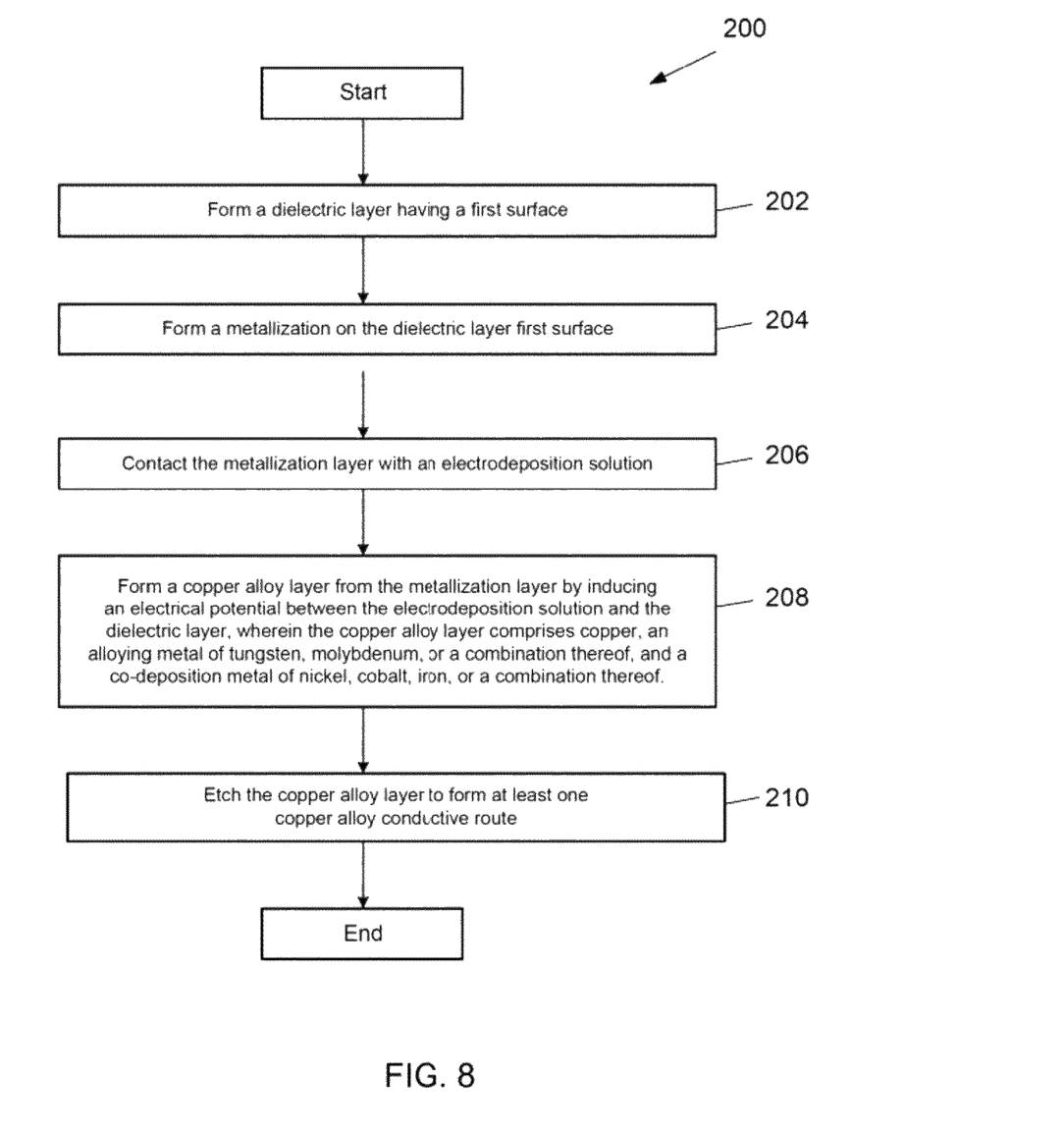
FIG. 8 is a flow chart of a process of fabricating a microelectronic substrate, according to an embodiment of the present description.

FIG. 8 is a flow chart of a process 200 of fabricating a microelectronic substrate according to an embodiment of the present description. As set forth in block 202, a dielectric layer having a first surface may be formed. A metallization layer may be formed on the dielectric layer first surface, as set forth in block 204. The dielectric layer first surface may be brought into contact with an electrodeposition solution, as set forth in block 206. As set forth in block 208, a copper alloy layer may be formed on the dielectric layer first surface by inducing an electrical potential between the electrodeposition solution and the dielectric layer, wherein the copper alloy layer comprises copper, an alloying metal of tungsten, molybdenum, or a combination thereof, and a co-deposition metal of nickel, cobalt, iron, or a combination thereof. The copper alloy layer may then be etched to form at least one copper alloy conductive route, as set forth in block 210.

Figure 9:
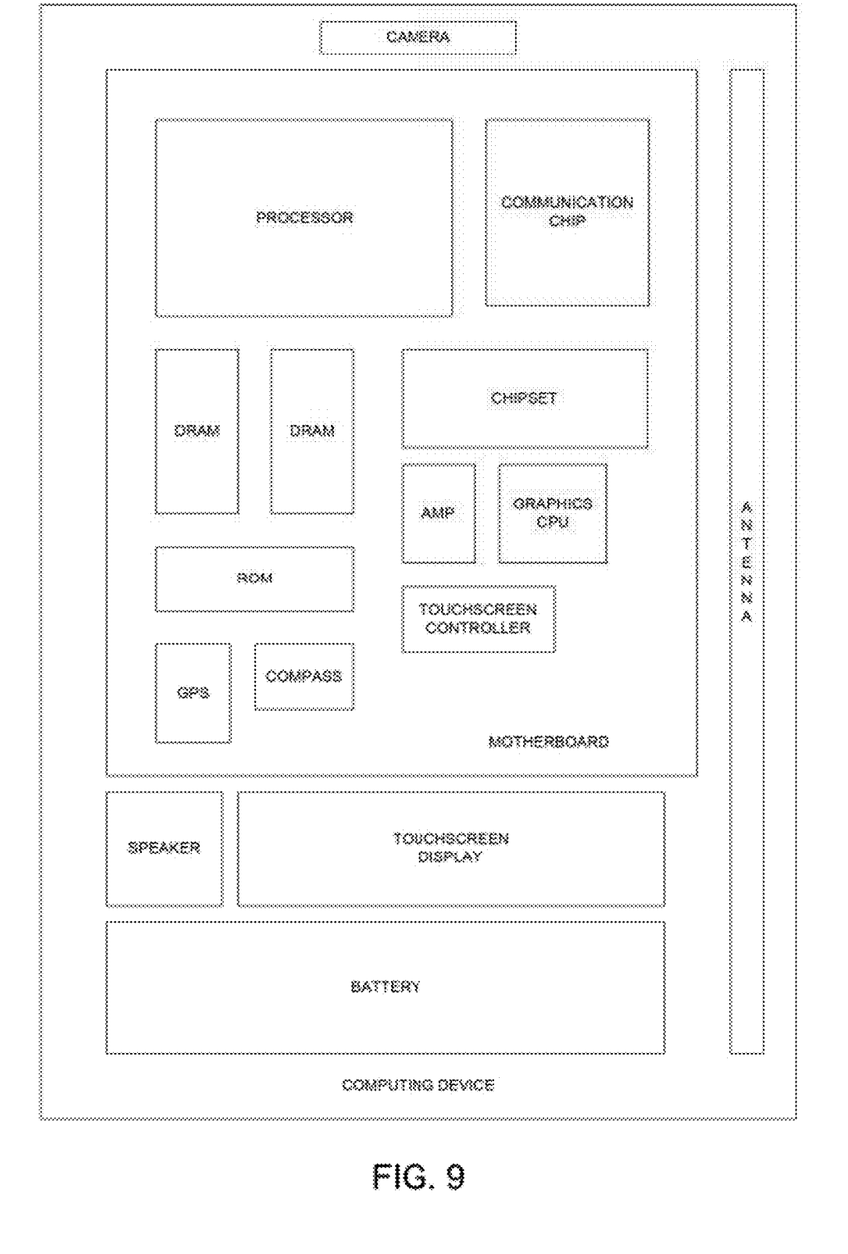
FIG. 9 illustrates a computing device in accordance with one implementation of the present description.

FIG. 9 illustrates an electronic or computing device in accordance with one implementation of the present description. The computing device houses a board. The board may include a number of microelectronic components, including but not limited to a processor, at least one communication chip, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the microelectronic components may be physically and electrically coupled to the board. In some implementations, at least one of the microelectronic components may be a part of the processor.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components may include a microelectronic substrate having copper alloy conductive routes as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-9. The subject matter may be applied to other microelectronic devices and assembly applications, as well as any appropriate electronic application, as will be understood to those skilled in the art.

The following examples pertain to further embodiments, wherein Example 1 is a microelectronic substrate, comprising at least one dielectric layer; and at least one copper alloy conductive route including a first surface abutting the dielectric layer and an opposing second surface, wherein the at least one copper alloy conductive route comprises copper and an alloying metal of tungsten, molybdenum, or a combination thereof.

In Example 2, the subject matter of Example 1 can optionally include the at least one copper alloy conductive route comprising between about 20% and 60% copper with the remainder being the alloying metal.

In Example 3, the subject matter of Example 1 can optionally include the at least one copper alloy conductive route comprising at least one graded copper alloy conductive route comprising between about 90% and 100% copper proximate one of the graded copper alloy layer first surface and the graded copper alloy layer second, and between about 0% and 10% copper proximate the other of the graded copper alloy layer first surface and the graded copper alloy layer second surface.

In Example 4, the subject matter of Example 1 can optionally include the at least one copper alloy conductive route further including a co-deposition metal.

In Example 5, the subject matter of Example 4 can optionally include the co-deposition metal comprising nickel, cobalt, iron, or a combination thereof.

In Example 6, the subject matter of Example 4 can optionally include the at least one copper alloy conductive route comprising between about 20% and 60% copper with the remainder being the alloying metal and the co-deposition metal.

In Example 7, the subject matter of Example 4 can optionally include the at least one copper alloy conductive route comprising at least one graded copper alloy conductive route comprising between about 90% and 100% copper proximate one of the graded copper alloy layer first surface and the graded copper alloy layer second, and between about 0% and 10% copper proximate the other of the graded copper alloy layer first surface and the graded copper alloy layer second surface.

In Example 8, the subject matter of Example 4 can optionally include the at least one graded copper alloy conductive route comprising a concentration of copper proximate one of the graded copper alloy layer first surface and the graded copper alloy second surface between about 90% and 100% and the remained being the alloying metal and the co-deposition metal, wherein the co-deposition metal has a concentration between about trace levels and 10% and, proximate the other of the graded copper alloy layer first surface and the graded copper alloy layer second surface, having a concentration of copper between about 0% and 10% and the remainder being the alloying metal and the co-deposition metal, wherein the co-deposition metal has a concentration is between about trace levels and 10%.

In Example 9, the subject matter of any of Examples 3, 7, and 8 can optionally include the copper of the at least one graded copper alloy conductive route having a substantially linear concentration gradient.

The following examples pertain to further embodiments, wherein Example 10 is a method of fabricating a microelectronic substrate, comprising forming a dielectric layer having first surface; forming a metallization layer on the dielectric layer first surface; contacting the metallization layer with an electrodeposition solution; and forming copper alloy layer from the metallization layer by inducing an electrical potential between the electrodeposition solution and the dielectric layer, wherein the copper alloy layer comprises copper, an alloying metal of tungsten, molybdenum, or a combination thereof, and a co-deposition metal of nickel, cobalt, iron, or a combination thereof, and wherein the copper alloy layer has a first surface adjacent the dielectric layer and an opposing second surface.

In Example 11, the subject matter of Example 10 can optionally include etching the copper alloy layer to form at least one copper alloy conductive route.

In Example 12, the subject matter of Example 10 can optionally include forming copper alloy layer on the dielectric layer first surface by inducing an electrical potential between the electrodeposition solution and the dielectric layer comprising forming a graded copper alloy layer by varying the electrical potential between the electrodeposition solution and the dielectric layer.

In Example 13, the subject matter of Example 12 can optionally include forming the graded copper alloy layer comprising forming the grade copper alloy layer having between about 90% and 100% copper proximate one of the graded copper alloy layer first surface and the graded copper alloy layer second, and between about 0% and 10% copper proximate the other of the graded copper alloy layer first surface and the graded copper alloy layer second surface.

In Example 14, the subject matter of Example 12 can optionally include forming the graded copper alloy layer comprising forming the grade copper alloy layer having a concentration of copper proximate one of the graded copper alloy layer first surface and the graded copper alloy second surface between about 90% and 100% and the remainder being the alloying metal and the co-deposition metal, wherein the co-deposition metal has a concentration between about trace levels and 10% and, proximate the other of the graded copper alloy layer first surface and the graded copper alloy layer second surface, a concentration of copper between about 0% and 10% and the remainder being the alloying metal and the co-deposition metal, wherein the co-deposition metal has a concentration between about trace levels and 10%.

In Example 15, the subject matter of Example 12 can optionally include etching the graded copper alloy layer to form at least one graded copper alloy conductive route.

In Example 16, the subject matter of any of Examples 12, 13, 14, and 15 can optionally include the copper of the graded copper alloy layer having a substantially linear concentration gradient.

The following examples pertain to further embodiments, wherein Example 17 is a computing device, comprising: a board; and a microelectronic component attached to the board, wherein the microelectronic component includes a microelectronic substrate that comprises at least one dielectric layer; and at least one copper alloy conductive route including a first surface abutting the dielectric layer and an opposing second surface, wherein the at least one copper alloy conductive route comprises copper and an alloying metal of tungsten, molybdenum, or a combination thereof.

In Example 18, the subject matter of Example 17 can optionally include the at least one copper alloy conductive route comprising between about 20% and 60% copper with the remainder being the alloying metal.

In Example 19, the subject matter of Example 17 can optionally include the at least one copper alloy conductive route comprising at least one graded copper alloy conductive route comprising between about 90% and 100% copper proximate one of the graded copper alloy layer first surface and the graded copper alloy layer second, and between about 0% and 10% copper proximate the other of the graded copper alloy layer first surface and the graded copper alloy layer second surface.

In Example 20, the subject matter of Example 17 can optionally include the at least one copper alloy conductive route further comprising a co-deposition metal.

In Example 21, the subject matter of Example 20 can optionally include the co-deposition metal comprising nickel, cobalt, iron, or a combination thereof.

In Example 22, the subject matter of Example 20 can optionally include the at least one copper alloy conductive route comprising between about 20 to 60% copper with the remainder being the alloying metal and the co-deposition metal.

In Example 23, the subject matter of Example 20 can optionally include the at least one copper alloy conductive route comprising at least one graded copper alloy conductive route comprising between about 90% and 100% copper proximate one of the graded copper alloy layer first surface and the graded copper alloy layer second, and between about 0% and 10% copper proximate the other of the graded copper alloy layer first surface and the graded copper alloy layer second surface.

In Example 24, the subject matter of Example 20 can optionally include the at least one graded copper alloy conductive route comprising a concentration of copper proximate one of the graded copper alloy layer first surface and the graded copper alloy second surface between about 90% and 100% and the remained being the alloying metal and the co-deposition metal, wherein the co-deposition metal has a concentration between about trace levels and 10% and, proximate the other of the graded copper alloy layer first surface and the graded copper alloy layer second surface, having a concentration of copper between about 0% and 10% and the remainder being the alloying metal and the co-deposition metal, wherein the co-deposition metal has a concentration is between about trace levels and 10%.

In Example 25, the subject matter of any of Examples 19, 23, and 24 can optionally include the copper of the at least one graded copper alloy conductive route having a substantially linear concentration gradient.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic substrate, comprising:
   at least one dielectric layer; and
   at least one copper alloy conductive route including a first surface abutting the dielectric layer and an opposing second surface, wherein the at least one copper alloy conductive route comprises copper and an alloying metal of tungsten, molybdenum, or a combination thereof;
   wherein the at least one copper alloy conductive route comprises at least one graded copper alloy conductive route comprising between about 90% and 100% copper proximate one of the graded copper alloy layer first surface and the graded copper alloy layer second surface, and between about 0% and 10% copper proximate the other of the graded copper alloy layer first surface and the graded copper alloy layer second surface.

2. The microelectronic substrate of claim 1, wherein the at least one copper alloy conductive route comprises between about 20% and 60% copper with the remainder being the alloying metal.

3. The microelectronic substrate of claim 1, wherein the copper of the at least one graded copper alloy conductive route has a substantially linear concentration gradient.

4. The microelectronic substrate of claim 1, wherein the at least one copper alloy conductive route further includes a co-deposition metal.

5. The microelectronic substrate of claim 4, wherein the co-deposition metal comprises nickel, cobalt, iron, or a combination thereof.

6. The microelectronic substrate of claim 4, wherein the at least one copper alloy conductive route comprises between about 20% and 60% copper with the remainder being the alloying metal and the co-deposition metal.

7. The microelectronic substrate of claim 4, wherein the at least one graded copper alloy conductive route comprises a concentration of copper proximate one of the graded copper alloy layer first surface and the graded copper alloy second surface between about 90% and 100% and the remained being the alloying metal and the co-deposition metal, wherein the co-deposition metal has a concentration between about trace levels and 10% and, proximate the other of the graded copper alloy layer first surface and the graded copper alloy layer second surface, having a concentration of copper between about 0% and 10% and the remainder being the alloying metal and the co-deposition metal, wherein the co-deposition metal has a concentration is between about trace levels and 10%.

8. The microelectronic substrate of claim 1, wherein the at least one copper alloy conductive route is substantially trapezoidal shape in cross-section.

9. The microelectronic substrate of claim 1, further comprising a core layer having at least one conductive through via, where the at least one copper alloy conductive route is in electrical contact with the at least one conductive through via.

10. The microelectronic substrate of claim 1, further comprising a microelectronic die, where the microelectronic die is in electrical contact with the at least one conductive through via.

11. A computing device, comprising:
    a board; and
    a microelectronic component attached to the board, wherein the microelectronic component includes a microelectronic substrate that comprises at least one dielectric layer; and
    at least one copper alloy conductive route including a first surface abutting the dielectric layer and an opposing second surface, wherein the at least one copper alloy conductive route comprises copper and an alloying metal of tungsten, molybdenum, or a combination thereof, wherein the at least one copper alloy conductive route comprises at least one graded copper alloy conductive route comprising between about 90% and 100% copper proximate one of the graded copper alloy layer first surface and the graded copper alloy layer second surface, and between about 0% and 10% copper proximate the other of the graded copper alloy layer first surface and the graded copper alloy layer second surface.

12. The computing device of claim 11, wherein the at least one copper alloy conductive route comprises between about 20% and 60% copper with the remainder being the alloying metal.

13. The computing device of claim 11, wherein the copper of the at least one graded copper alloy conductive route has a substantially linear concentration gradient.

14. The computing device of claim 11, wherein the at least one copper alloy conductive route further comprises a co-deposition metal.

15. The computing device of claim 14, wherein the co-deposition metal comprises nickel, cobalt, iron, or a combination thereof.

16. The computing device of claim 14, wherein the at least one copper alloy conductive route comprises between about 20 to 60% copper with the remainder being the alloying metal and the co-deposition metal.

17. The computing device of claim 14, wherein the at least one graded copper alloy conductive route comprises a concentration of copper proximate one of the graded copper alloy layer first surface and the graded copper alloy second surface between about 90% and 100% and the remained being the alloying metal and the co-deposition metal, wherein the co-deposition metal has a concentration between about trace levels and 10% and, proximate the other of the graded copper alloy layer first surface and the graded copper alloy layer second surface, having a concentration of copper between about 0% and 10% and the remainder being the alloying metal and the co-deposition metal, wherein the co-deposition metal has a concentration is between about trace levels and 10%.

18. The computing device of claim 11, wherein the at least one copper alloy conductive route is substantially trapezoidal shape in cross-section.

19. The computing device of claim 11, further comprising a core layer having at least one conductive through via, where the at least one copper alloy conductive route is in electrical contact with the at least one conductive through via.

20. The computing device of claim 11, further comprising a microelectronic die, where the microelectronic die is in electrical contact with the at least one conductive through via.

* * * * *